(12) United States Patent
Saxena et al.

(10) Patent No.: US 10,672,902 B2
(45) Date of Patent: Jun. 2, 2020

(54) BIDIRECTIONAL POWER MOSFET STRUCTURE WITH A CATHODE SHORT STRUCTURE

(71) Applicant: NXP USA, Inc., Austin, TX (US)

(72) Inventors: Tanuj Saxena, Chandler, AZ (US); Vishnu K. Khemka, Chandler, AZ (US); Raghu Gupta, Austin, TX (US); Moaniss Zitouni, Gilbert, AZ (US); Ganming Qin, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/377,571

(22) Filed: Apr. 8, 2019

(65) Prior Publication Data

US 2019/0237571 A1  Aug. 1, 2019

Related U.S. Application Data

(62) Division of application No. 15/720,097, filed on Sep. 29, 2017, now Pat. No. 10,297,684.

(51) Int. Cl.
*H01L 29/66* (2006.01)
*H01L 29/78* (2006.01)
*H01L 29/08* (2006.01)

(52) U.S. Cl.
CPC ........ *H01L 29/7803* (2013.01); *H01L 29/086* (2013.01); *H01L 29/66734* (2013.01); *H01L 29/7813* (2013.01)

(58) Field of Classification Search
None
See application file for complete search history.

(56) References Cited

U.S. PATENT DOCUMENTS

| | | | | |
|---|---|---|---|---|
| 6,476,442 B1* | 11/2002 | Williams | ............ | H01L 27/0727 257/328 |
| 2006/0214221 A1* | 9/2006 | Challa | ................. | H01L 21/3065 257/328 |
| 2009/0283796 A1* | 11/2009 | Udrea | ................. | H01L 29/0834 257/139 |

* cited by examiner

*Primary Examiner* — Calvin Y Choi

(57) ABSTRACT

A field effect device includes a semiconductor body separating a source and a drain, both source and drain coupled to the semiconductor body. An insulated control gate is located over the semiconductor body between the source and drain and configured to control a conductive channel extending between the source and drain. First and second doped regions such as highly-doped regions are adjacent to the source. The first or second doped region may be a cathode short region electrically coupled to the source. The cathode short region may be used in a bidirectional power MOSFET.

20 Claims, 10 Drawing Sheets

BIDIRECTIONAL POWER MOSFET STRUCTURE WITH A CATHODE SHORT STRUCTURE

BACKGROUND

Field of the Disclosure

The present disclosure relates generally to field effect devices, and specifically to bidirectional devices including metal-oxide-semiconductor field-effect transistors (MOSFETs).

Description of the Related Art

A MOSFET device operates by virtue of a field controlled channel established in a semiconductor body or surface. Power MOSFETs are useful in various applications such as synchronous rectifier circuits. Many power MOSFETs exhibit useful features including low on-resistances, fast switching speeds, high withstand voltage capability, bidirectionality for use in AC circuits, and a control electrode isolated from current conducting silicon thereby removing the need for a continuous "on" current. Power MOSFETs have certain advantages over conventional devices such as PN junction rectifiers, Schottky rectifiers, or bipolar transistor synchronous rectifiers.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

In a conventional bidirectional power metal-oxide-semiconductor field-effect transistor (MOSFET), parasitic bipolar behavior is limited by a lateral body resistance that generally is improved by using an optimized layout. Conventional techniques attempt to mitigate the parasitic bipolar behavior (such as in unidirectional MOSFETs) by one or more of: reducing the lateral resistance of the body under the source; providing lower route resistance for the impact ionization generated holes (for N-channel MOSFETs); and reducing the minority carrier lifetime in the base region. Similar techniques can be applied to bidirectional MOSFETs but are limited by the performance specifications of the field effect device, especially the on resistance and reverse breakdown.

FIGS. 1-17 illustrate a device that addresses parasitic bipolar behavior by employing, at least in part, a shorted doped region, of the opposite conductivity type, near a terminal or end of the field effect device, such as the source of a transistor. The shorted doped region can be used irrespective of other enhancements in a field effect device structure. The shorted doped region further improves a device's energy capability.

According to some embodiments, a P+ region abuts an N+ region in a source region for an N-type MOSFET. This P+ region is connected to the source metallization—shorting the P+ region with the source N+ region. The P+ region is isolated from the P− body through a N− drift region or use of a material such as a dielectric material placed in a trench using a shallow trench isolation (STI) or box isolation technique. The P+ region acts as an absorber of holes injected from the P− body of the device into the N− drift region. The P+ region reduces a gain of a parasitic bipolar as the device is turned on. Reduction in parasitic bipolar gain reduces a magnitude of regenerative action and delays the destruction of the device. An additional P+ region can be introduced in all device cells thereby weakening the parasitic bipolar effect in the device.

Figure 1:
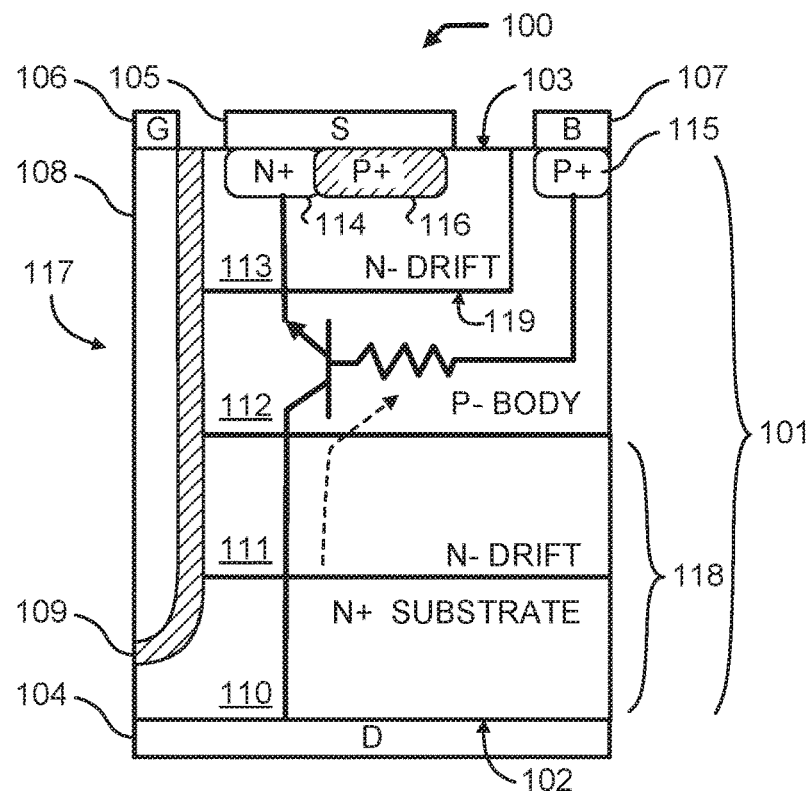
FIG. 1 is a diagram illustrating a cross-section view of a field effect device employing a cathode short region in accordance with some embodiments.

FIG. 1 is a diagram illustrating a cross-section view of a field effect device 100 employing a cathode short region in accordance with some embodiments. In the depicted example, the field effect device 100 is an N-type power metal-oxide-semiconductor field-effect transistor (MOSFET). The field effect device 100 comprises a semiconductor substrate 101 or semiconductor body having a first surface 102 and a second surface 103. The field effect device 100 further includes a drain contact 104 adjacent or coupled to the first surface 102, and a source contact 105 adjacent or coupled to the second surface 103.

The field effect device 100 also includes an insulated gate 117 that provides turn-on and turn-off control upon the application of an appropriate gate bias. The insulated gate 117 includes a gate material 108 and insulation material 109. In one embodiment, a gate contact 106 is adjacent or coupled to the gate material 108.

The semiconductor substrate 101 includes a highly-doped region such as an N+ substrate 110 adjacent to the drain contact 104. An N− drift region 111 lies adjacent to the N+ substrate 110. A P− body region 112 lies adjacent to the N-drift region 111. The P− body region 112 includes a highly-doped region such as a P+ region 115 adjacent to the body contact 107. The P− body region 112 may be extended to a final form in order to more easily place a body contact 107 or other reasons. Thus, the P− body region 112 may include a body extension or extension region. The semiconductor body 101 includes an N− drift region 113 that separates the P− body region 112 from the source contact 105. The separation of the source and body regions allows for the bidirectional operation of the device.

Turn-on in the field effect device 100 occurs when a conductive N-type inversion layer is formed in the P-type channel region in response to application of a positive gate bias. In forward operation, the inversion layer electrically connects an N-type source or cathode region 119 and an N-type drain or anode region 118 in the semiconductor body 101 and allows for majority carrier conduction therebetween.

Bidirectional power MOSFETs are prone to early failure in high voltage-high current conditions due to the turning on of the inevitable parasitic bipolar in the structure. To mitigate the parasitic bipolar, as further described herein, a cathode short 116 (e.g., a P+ region) abuts a highly-doped region such as an N+ region 114 proximate to the source as indicated by the source contact 105. The N+ region 114 is of a different conductivity type as the semiconductor body region 112. A region 116 is a cathode short region, a first doped region of the same conductivity type as the semiconductor body region 112, adjacent to the source such as adjacent to the source contact 105. According to some embodiments, the cathode short 116 is a doped region that is shorted by way of a source contact 105. This P+ region 116 can act as an absorber of holes and significantly reduces the gain of the bipolar transistor of the MOSFET (shown for convenience in the P− body region 112 of FIG. 1) and increases the sustaining voltage. The P+ region 116 delays destruction of the field effect device 100 and improves its energy capability under the forward operation of the device.

Further, in some embodiments, the illustrated field effect device 100 provides the ability to replace multiple back-to-back unidirectional MOSFETs with a single bidirectional power MOSFET device. For bidirectional blocking, the P− body region 112 of the device 100 is not hard tied to the source 105. Even when the source and body contacts are connected to the same potential outside the device, the parasitic bipolar behavior can be worsened by additional parasitic resistances such as the lateral base resistance as indicated in the P− body region in FIG. 1 and the external routing resistance (e.g., application of resistive material) coupled to the body contact 107. For sake of convenience, resistive material is not illustrated in FIG. 1. Triggering of the parasitic bipolar behavior may cause the field effect device 100 to latch up and possibly destroy itself. Reduction in lateral resistance, such as by increased base doping, comes at the cost of increased threshold voltage. Reduction in routing resistance at the body contact 107 comes at the cost of reduced source contact area at the second surface 103 and hence a higher on-resistance of the field effect device 100.

As may be evident in FIG. 1, under forward operation, the parasitic bipolar may be triggered at high-voltage, high-current conditions encountered in inductive load switching or high dV/dt conditions. Impact ionization generated holes can turn on the body-source junction 119—one of the P-N junctions—through a lateral voltage drop combined with a voltage drop on the body routing bus. Electrons back injected from the emitter can multiply at the body-drain junction (e.g., produce more holes), which lead to a higher lateral voltage drop causing a regenerative action. The field effect device 100 may heat up during such a regenerative action resulting in an increase of the base resistance and a decrease of the diode forward voltage. Eventually, the device destructs and can do so in localized regions. As described in relation to the various embodiments described herein, a cathode short region, such as the cathode short region 116 of FIG. 1, can reduce the gain of the parasitic bipolar and makes the bidirectional MOSFET stronger.

Figure 2:
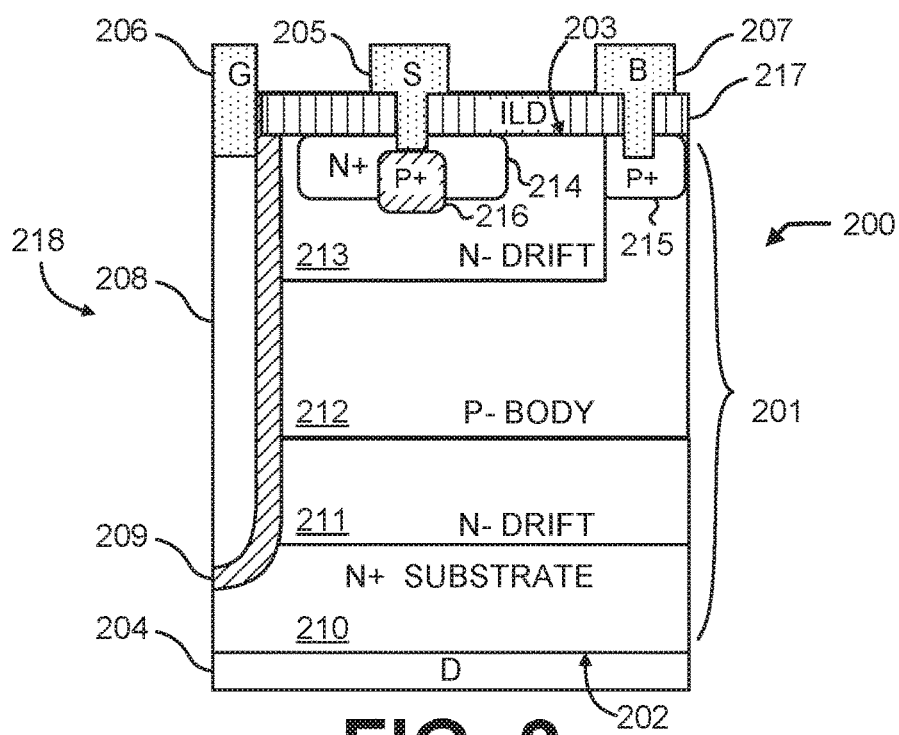
FIG. 2 is a diagram illustrating a cross-section view of another field effect device employing a cathode short region in accordance with some embodiments.

FIG. 2 is a diagram illustrating a cross-section view of field effect device 200 employing a cathode short region in accordance with some embodiments. A cathode short region or "cathode short" refers to a cathode region that is shorted with a contact or material with a relatively high conductivity. As illustrated, the device 200 includes a semiconductor substrate 201 having a first surface 202 and a second surface 203. At the first surface 202, the semiconductor substrate 201 includes a N-type substrate such as a N+ substrate 210 that is adjacent to a drain material or drain contact 204. Adjacent to the N+ substrate 210 is an N− drift region or layer 211. A P-type body region 212 separates the first N− drift layer 211 from a second N− drift region or layer 213.

Along a portion of the N+ substrate 210, the N− drift layer 211, the P-type body region 212, and the N− drift layer 213 is an insulation material 209 and a gate material 208. The gate material 208 and the insulation material 209 comprise an insulated gate 218. Application of a voltage at the insulated gate 218 causes a field to form in the device 200. A portion of the gate material 208 may be coupled to a gate contact 206.

An interlayer dielectric (ILD) layer 217 is at the second surface 203 and may be formed there during construction of the device 200. Passing through the ILD layer 217 may be the gate contact 206, a source contact 205, and a body contact 207. At the ILD layer 217, a first N+ region 214 and a P+ region 216 are formed in the second N− drift layer 213. The P− body 212 may include a P+ region 215. Each of the N+ and P+ regions may be formed in a same step or in separate steps. The P+ region 216 acts as a cathode short and is electrically coupled to the source contact 205 in FIG. 2. Further, the P+ region 216 is adjacent N+ material 214 that is on a left side and a right side of the P+ region 216 in FIG. 2. The N+ material 214 is of a different conductivity type as the semiconductor body region 112. Other arrangements of one or more N+ regions, such as the N+ region 214, and one or more P+ regions, such as the P+ region 216, are possible. Other example embodiments are shown in other figures and further described herein.

Figure 3:
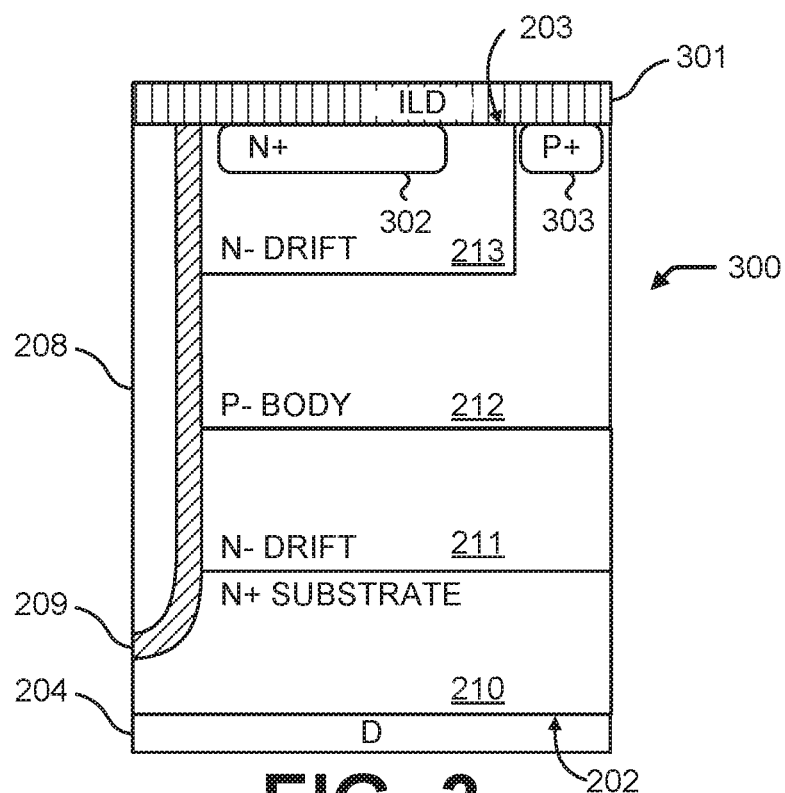
FIGS. 3-5 are diagrams illustrating cross-sectional views of the field effect device of FIG. 2 in various stages of formation.
Figure 4:
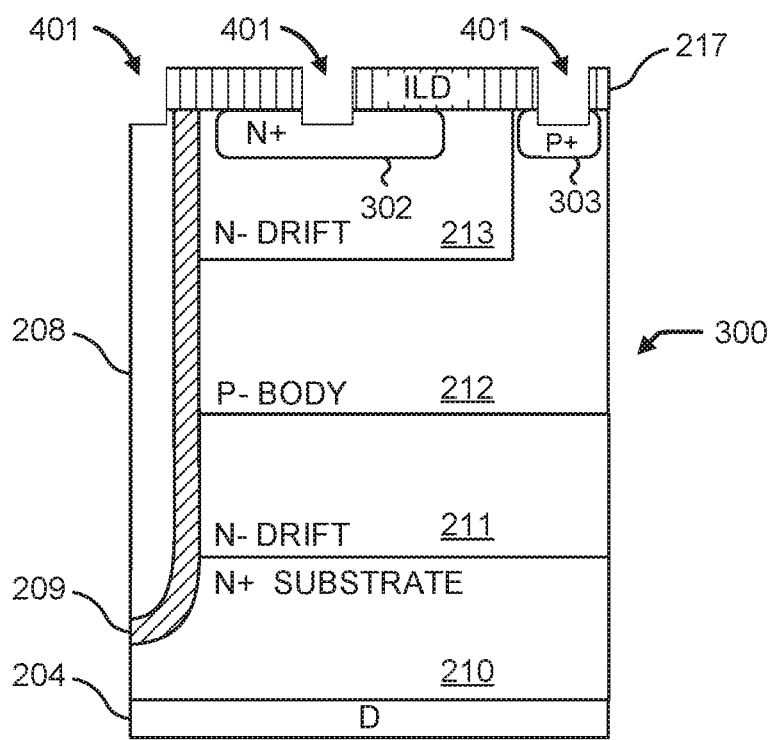
Figure 5:
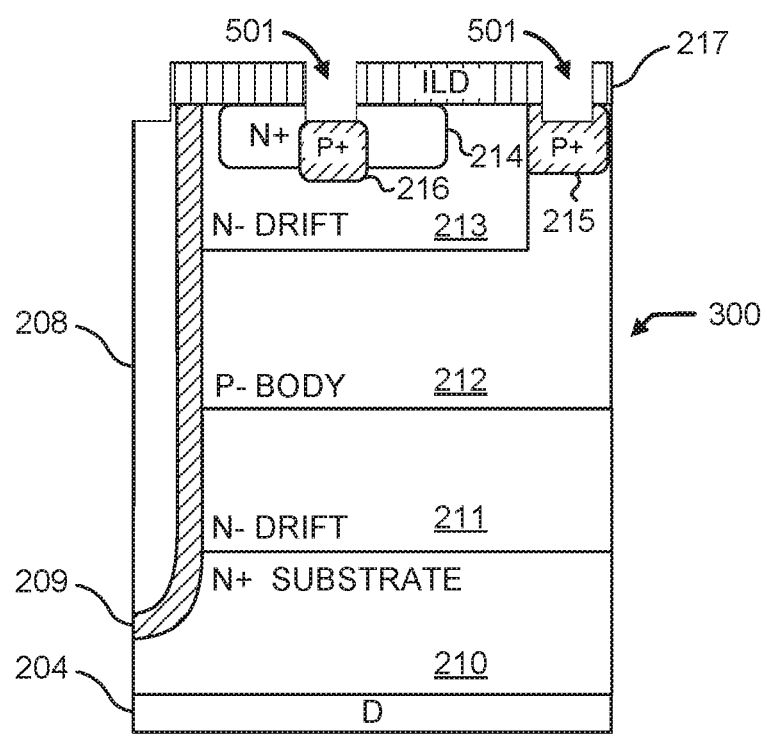

FIGS. 3-5 are diagrams of a cross-sectional view of the embodiment of the device 200 illustrated in FIG. 2 in various stages of fabrication. In FIG. 3, a workpiece 300 is illustrated at a first example stage of formation. At this first stage, an ILD layer 301 has been formed on a second surface 203 of the workpiece 300. A first N− drift region 211 has been formed on top of an N-type substrate such as the N+ substrate 210. A first surface 202 of the device 200 303 is adjacent to the drain contact 204 thereby coupling the N+ substrate 210 with the drain contact 204. A body region 212 of a P− type has been formed as a layer adjacent to the first N− drift layer 211. A second N− drift layer 213 has been formed on the body region 212. An N+ region 302 is formed in the second N− drift layer 213 adjacent the ILD layer 301. A P+ region 303 is formed in a portion of the P− type body region 212. The P+ region 303 is adjacent the ILD layer 301. During formation, the body region 212 may be formed up to an ILD layer 301 in preparation for coupling the body layer or body region 212 to a body contact, which is not illustrated in FIG. 3. A gate material 208 is applied outside of an insulation material 209 applied along a surface of the N+ substrate 210, the first N− drift layer 211, the P-type body region 212, and the second N− drift layer 213.

In FIG. 4, fabrication of the workpiece 300 of FIG. 3 has advanced to a second stage. At this second example stage, the ILD layer 301 of FIG. 3 has been slightly over-etched through the ILD layer 217. Trenches 401 have been formed therein, the trenches passing into the material below including the gate material 208, the N+ region 302, and the P+ region 303. The ILD layer has been transformed into the ILD layer 217 first illustrated in FIG. 2.

In FIG. 5, the workpiece 300 of FIG. 4 has advanced to another stage. At this third example stage, P+ material 501 has been added into the trenches 401 of FIG. 4. The P+ material 501 is a same conductivity type as the type of the doping of the body region 212. Accordingly, a first P+ region 216 has been formed in the N− drift layer 213 and through the N+ region 214. The first P+ region 216 is isolated from the gate material 208 and the insulation material 209 by the N+ region 214 and N− layer 213. Further a second P+ region 215 has been formed in the P-type body region 212. A subsequent step in a method of formation would place contacts or contact material in the trenches as shown in FIG. 2. Thus, FIGS. 3-5 illustrate a sequence of steps of a method of formation of the device 200 of FIG. 2.

Figure 6:
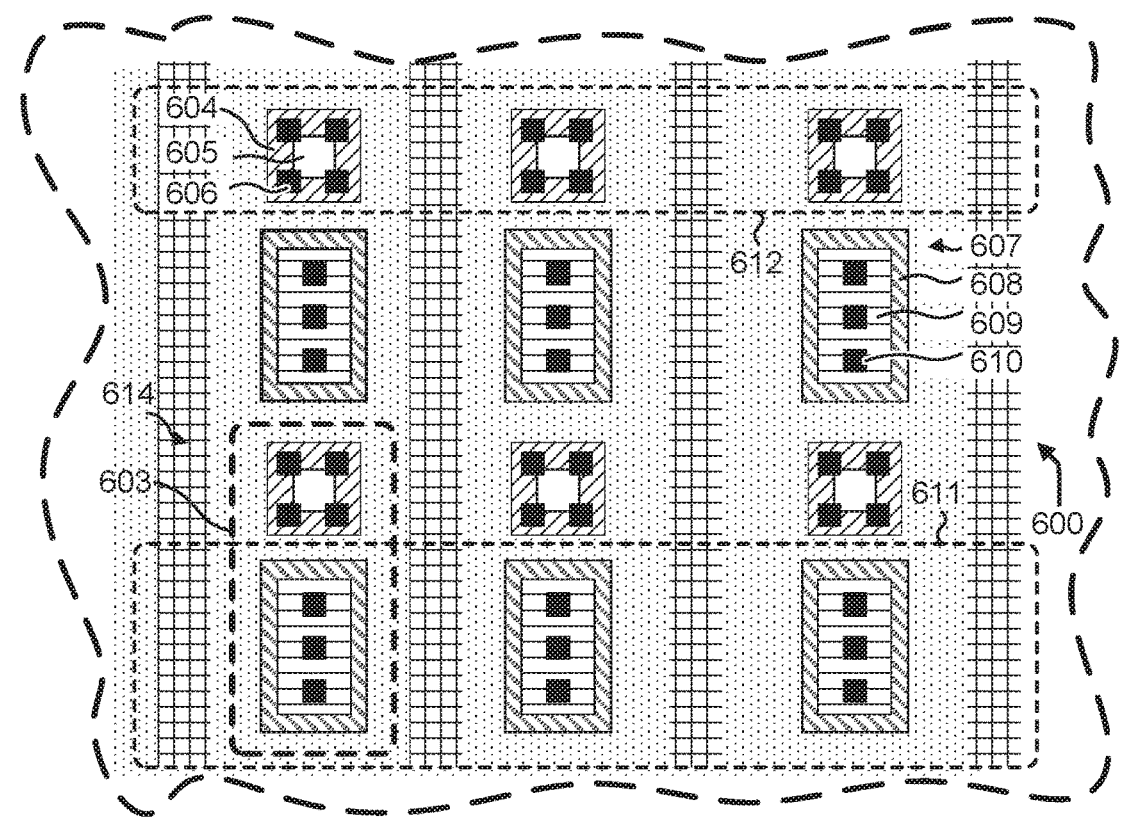
FIG. 6 is a diagram illustrating a top view of a semiconductor layout using a P+ region proximate a source of a field effect device in accordance with some embodiments.

FIG. 6 is a diagram that illustrates a top view of a first semiconductor layout using a P+ region proximate a source of a field effect device in accordance with some embodiments. The P+ region of FIG. 6 is an embodiment of a cathode short region such as the P+ region 116 in FIG. 1 and the P+ region 216 in FIG. 2.

In FIG. 6, the semiconductor layout 600 includes several materials applied as layers to create a field effect device of desired size. For example, the layout 600 includes a plurality of gate columns 614. According to some embodiments, a gate column 614 includes a gate material and an insulative material. The layout 600 also includes N+ regions 604. P+ regions 605 are inside the N+ regions 604. The P+ regions 605 may be P+ implants. The P+ regions 605 are cathode shorts—cathode short regions—for the device of the layout 600. Source contacts 606 are placed over or at an intersection of the N+ regions 604 and the P+ regions 605. One or more source contact layers 612 may be placed onto the device of the layout 600 in contact with the source contacts 606. While not illustrated, source contacts 606 may be coupled to metal traces, vias, and the like thereby routed out to another metal layer.

In FIG. 6, the layout 600 also includes partially exposed N− drift regions 607 outside of STI material 608. Enclosed by the STI material 608 are P+ regions 609. The P+ regions 605 are of a same conductivity type as the P+ regions 609. Body contacts 610 are coupled to a body region portion of the device such as being coupled to the P+ regions 609. One or more body contact layers 611 may be placed onto the device of the layout 600 in contact with the body contacts 610. A unit or cell 603 includes a set of N+ regions 604, a set of P+ regions 605, and a set of source contacts 606. The cell 603 also includes a set of body contacts 610, a P+ region 609, STI material 608, and an N− drift region 607.

Figure 7:
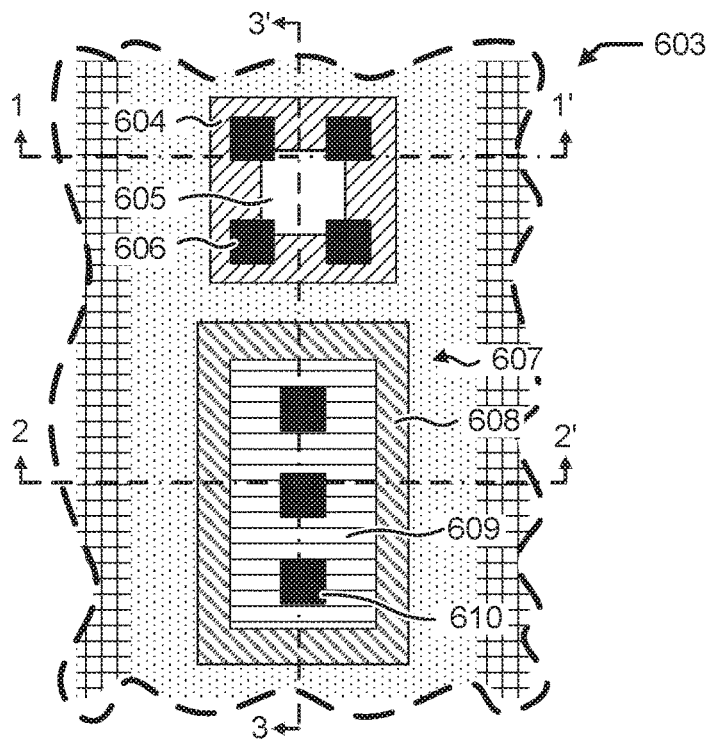
FIG. 7 is a diagram illustrating a cell of the semiconductor layout illustrated in FIG. 6 in accordance with some embodiments.

FIG. 7 is a diagram that illustrates a cell 603 of the semiconductor layout first illustrated in FIG. 6. A unit or cell 603 includes a set of N+ regions 604, a set of P+ regions 605, and a set of source contacts 606. The cell 603 also includes a set of body contacts, a P+ region, STI material, and an N− drift region. Three cross-sectional views are indicated: a first cross-sectional view along line 1-1' corresponding to FIG. 8, a second cross-sectional view along line 2-2' corresponding to FIG. 9, and a third cross-sectional view along line 3-3' corresponding to FIG. 10.

Figure 8:
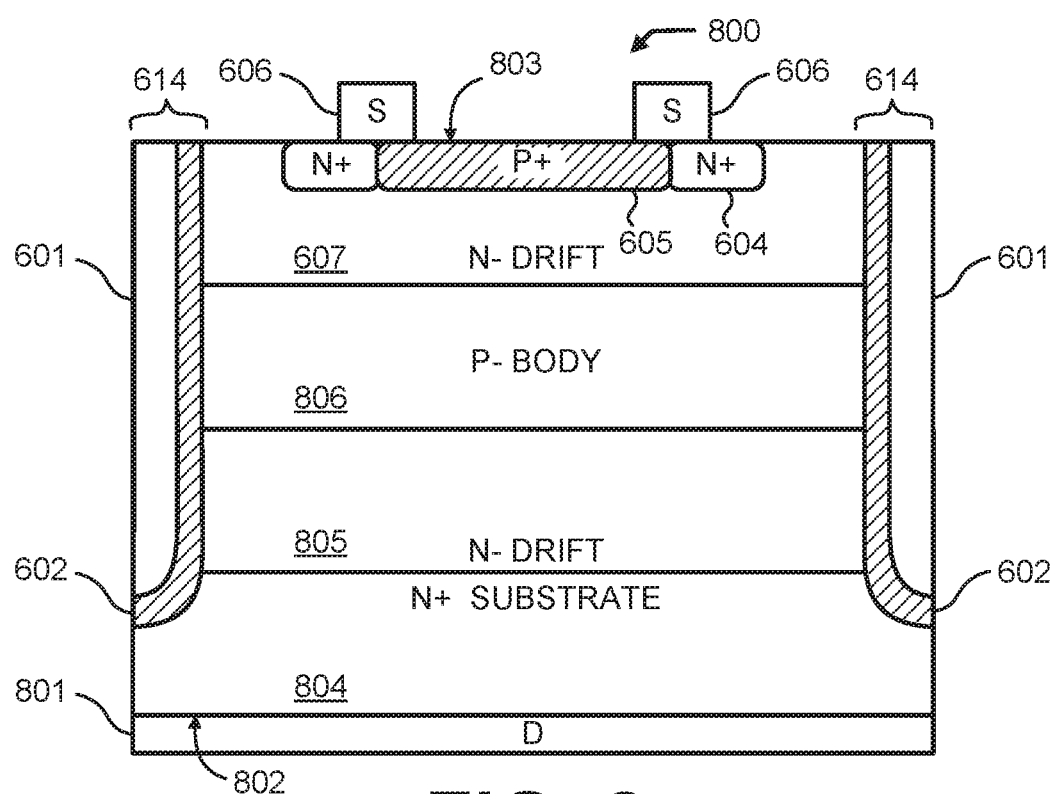
FIGS. 8-10 are diagrams illustrating cross-sectional views of the cell illustrated in FIG. 7 in accordance with some embodiments.

FIG. 8 is a diagram illustrating a cross-sectional view of the cell 603 first illustrated in FIG. 6. FIG. 8 is the cross-section along line 1-1' as shown in FIG. 7. In FIG. 8, the device 800 includes several layers of a semiconductor substrate, in order from bottom to top: a first N-type substrate such as a first N+ substrate region 804, an N− drift region 805, a P-type body region such as P− body region 806, and a second N− drift region 607. The first N+ substrate region 804 includes a first surface 802 adjacent to a drain contact 801. An insulator material 602 lies adjacent to the first N− drift region 805, the P− body region 806, and the second N− drift region 607. Gate material 601 lies next to the insulator material 602 within the gate column 614. The insulator material 602 may be assembled to the device 800 in a separate step from assembling the gate material 601. In FIG. 8, two N+ regions 604 and a P+ region 605 are surrounded by the second N− drift region 607. The N+ regions 604 create a ring in which the island of P+ region 605 is located. Source contacts 606 are positioned adjacent to both the N+ regions 604 and the P+ region 605 thereby electrically coupling or shorting the P+ region 605 with the N+ regions 604. The P+ region 605 is of a same conductivity type as the P− body region 806.

Figure 9:
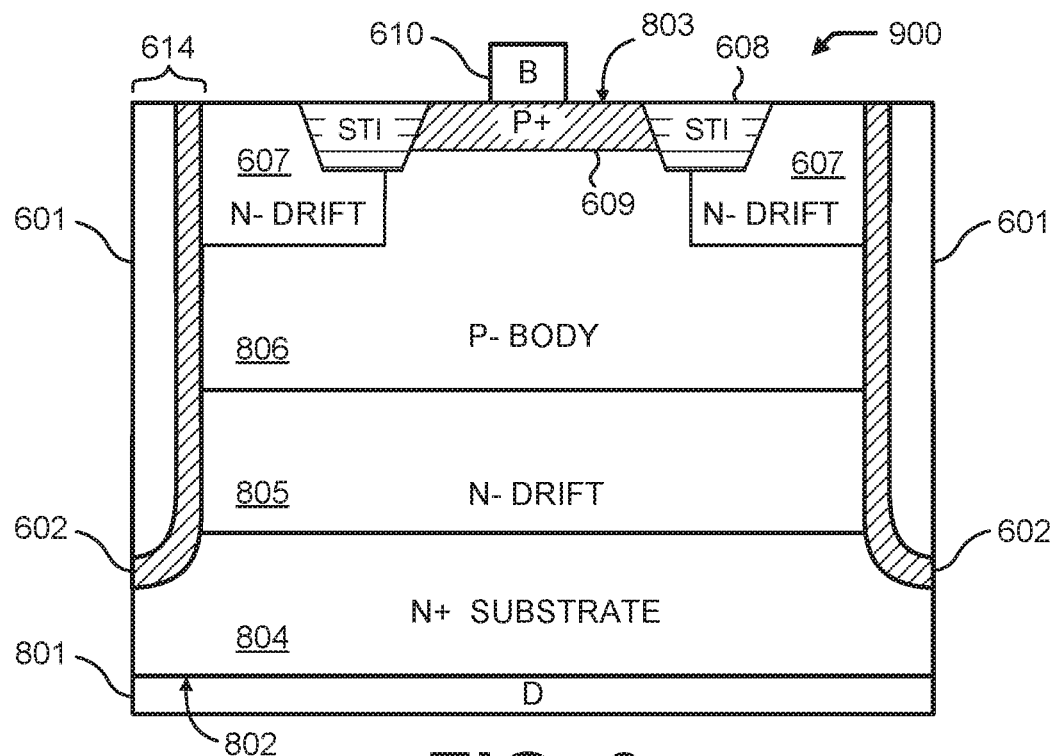

FIG. 9 is a diagram illustrating a cross-sectional view of the cell 603 first illustrated in FIG. 6 in a plane parallel to the cross-sectional plane of the view illustrated in FIG. 8. FIG. 9 is the cross-section along line 2-2' as shown in FIG. 7.

In FIG. 9, the device 900 includes the layers of the semiconductor substrate, in order from bottom to top: the first N+ substrate region 804, the N− drift region 805, the P− body region 806, and the second N− drift region 607. The first N+ substrate region 804 includes the first surface 802 adjacent to the drain contact 801. The insulator material 602 lies adjacent to the first N− drift region 805, the P− body region 806, and the second N-drift region 607. Gate material 601 lies next to the insulator material 602 within the gate column 614. In FIG. 9, the second N− drift region 607 is separated from the body P+ region 609 by STI material 608. A body contact 610 is positioned adjacent to the P+ region 609 at the second surface 803. While not illustrated in FIG. 9, an insulating layer may be formed or placed adjacent to the second surface 803.

Figure 10:
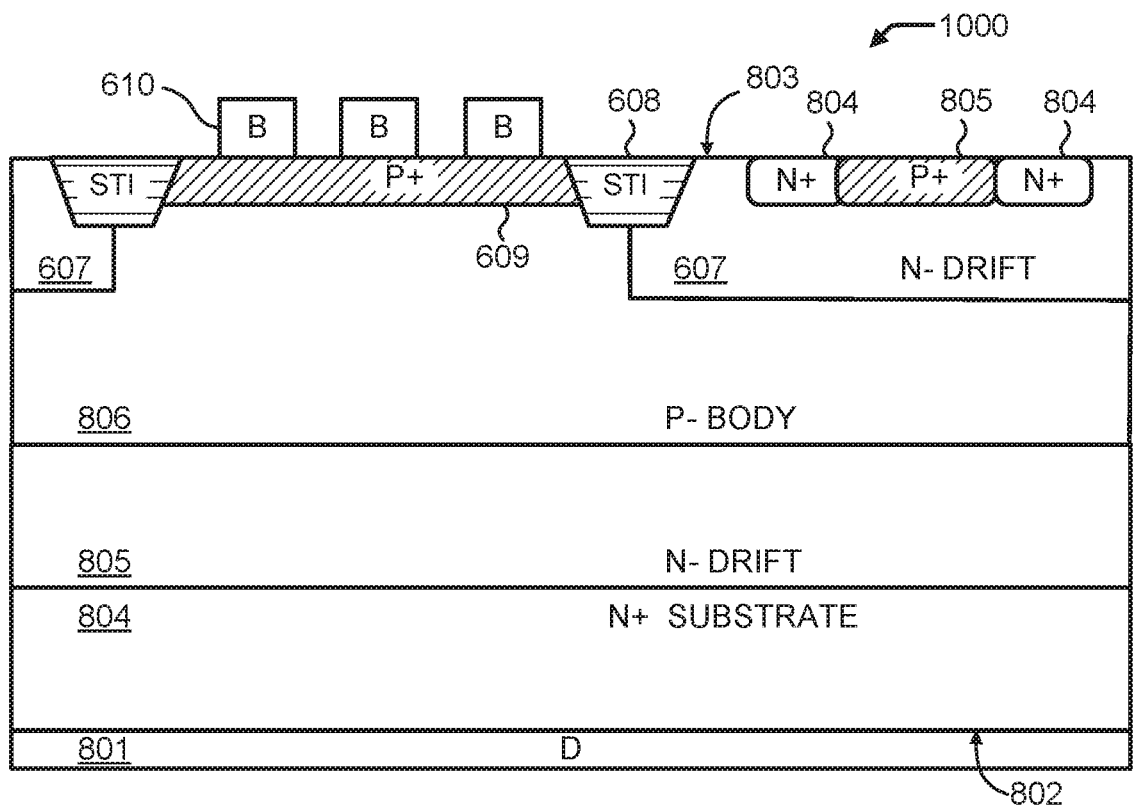

FIG. 10 is a diagram illustrating a cross-sectional view of the cell 603 first illustrated in FIG. 6 in a plane perpendicular to the cross-sectional planes of the views illustrated in FIGS. 8 and 9. FIG. 10 is the cross-section along line 3-3' as shown in FIG. 10.

In FIG. 10, the device 1000 includes the layers of the semiconductor substrate, in order from bottom to top: the first N+ substrate region 804, the N− drift region 805, the P− body region 806, and the second N− drift region 607. The first N+ substrate region 804 includes the first surface 802 adjacent to the drain contact 801. In FIG. 10, the second N-drift region 607 is separated from the body P+ region 609 by STI material 608. Body contacts 610 are positioned adjacent to the P+ region 609 at the second surface 803. Two portions of the N+ region 804 isolate the P+ region 805 at the top surface 803. The two portions of the N+ region 804 and the P+ region 805 are surrounded by the second N-drift region 607.

Figure 11:
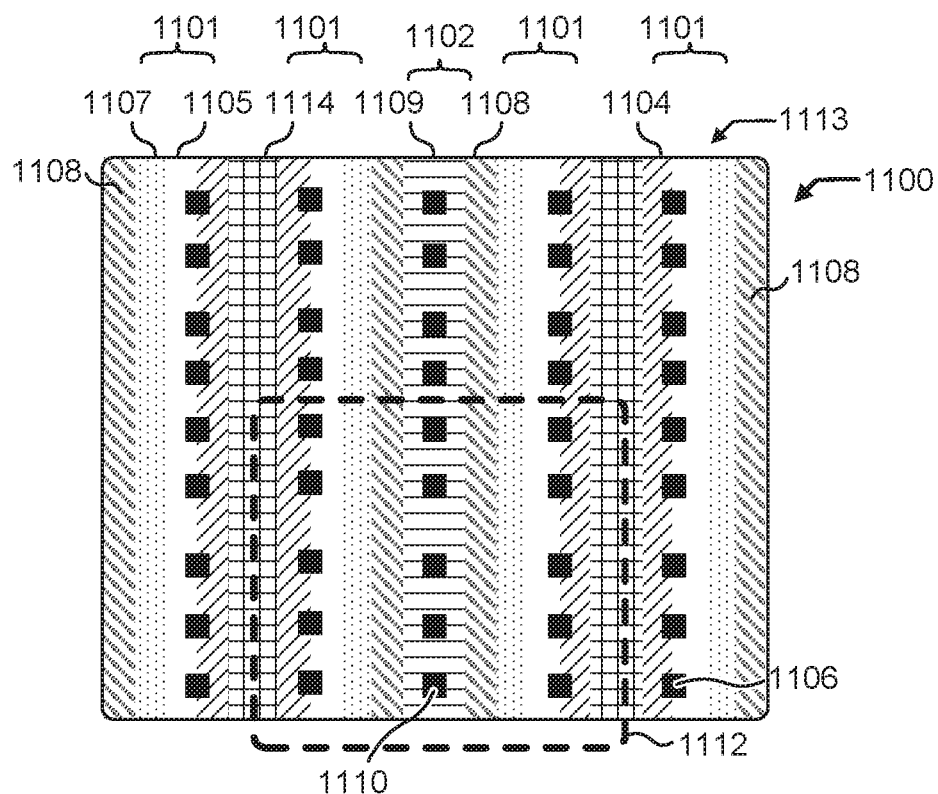
FIG. 11 is a diagram illustrating a top view of another semiconductor layout using a P+ region proximate a source of a field effect device in accordance with some embodiments.

FIG. 11 is a diagram that illustrates a top view of a second example semiconductor layout using a P+ region proximate a source of a field effect device in accordance with some embodiments. In FIG. 11, from left to right, various columns 1113 of material are formed into a field effect device 1100. The device 1100 may extend to an arbitrary first dimension from left to right thereby having an arbitrary number of columns 1113 of material. That is, a unit 1112 of the semiconductor device 1100 may be repeated horizontally in FIG. 11 one or more times. Further, the device 1100 may extend to an arbitrary second dimension from top to bottom thereby having an arbitrary number of contacts 1106, 1110 in the device 1100. The device 1100 is comprised of alternating sequences of gate column regions 1114, source column regions 1101, and body column regions 1102 according to some embodiments.

In FIG. 11, the device 1100 includes columns of N− drift material 1107, source-located P+ material 1105, N+ material 1104, gate column 1114, STI material 1108, and body-located P+ material 1109. The STI material 1108 is used to isolate a P− body (via the body-located P+ material 1109) from the N− drift material 1107. The source-located P+ material 1105 and the body-located P+ material 1109 are illustrated in FIG. 11 as a same black-filled material. In practice, the source-located P+ material 1105 may be different from the body-located P+ material 1109 in terms of composition of doping material, amount of doping material, area of application of doping material, volume of doping material, and so forth including combinations of the same.

Columns of source contacts 1106 are placed along source regions 1101 of the device 1100 in various positions. According to some embodiments, and as in FIG. 11, the source contacts 1106 are positioned at regular intervals vertically along the device 1100, and positioned horizontally at the intersection of the source-located P+ material 1105 and the N+ material 1104. In FIG. 11, columns of body contacts 1110 are placed along the body-located P+ material 1109. Source contacts 1106 and body contacts 1110 may be routed out through metal traces, metal vias, and the like to metal or conductive layers of the device 1100.

In the device 1100, the N+ material 1105 is positioned adjacent to the source-located P+ material 1104. In other embodiments, positions of the N+ material 1105 may be positioned on an opposite side of the source-located P+ material 1104. Columns 1113 of semiconductor material are created according to epitaxial layer building processes.

Figure 12:
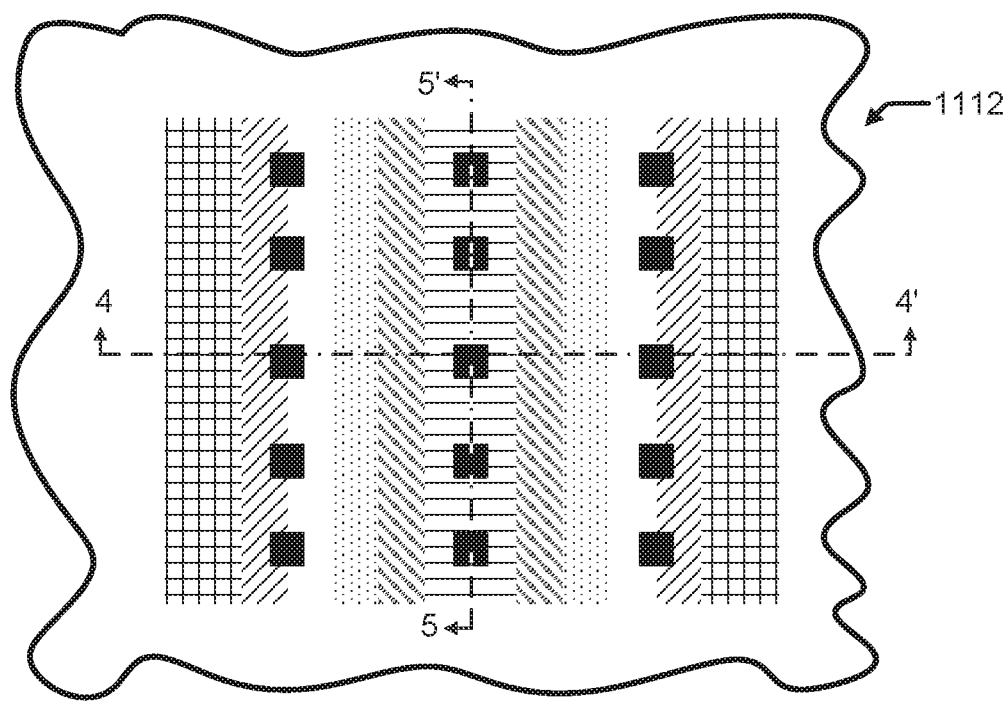
FIG. 12 is a diagram illustrating a portion of the semiconductor layout illustrated in FIG. 11 in accordance with some embodiments.

FIG. 12 illustrates a portion and repeatable unit 1112 of the semiconductor layout first illustrated in FIG. 11. The unit 1112 includes columns of N− drift material, source-located P+ material, N+ material contacting the N− drift material, gates, STI material, and body-located P+ material. Two cross-sectional views are indicated: a first cross-sectional view along line 4-4' corresponding to FIG. 13, and a second cross-sectional view along line 5-5' corresponding to FIG. 14. FIGS. 11 and 12 illustrate that source and body contact regions run parallel to each other and to the gate. The gates may be formed by way of gate trenches formed in the device 1100.

Figure 13:
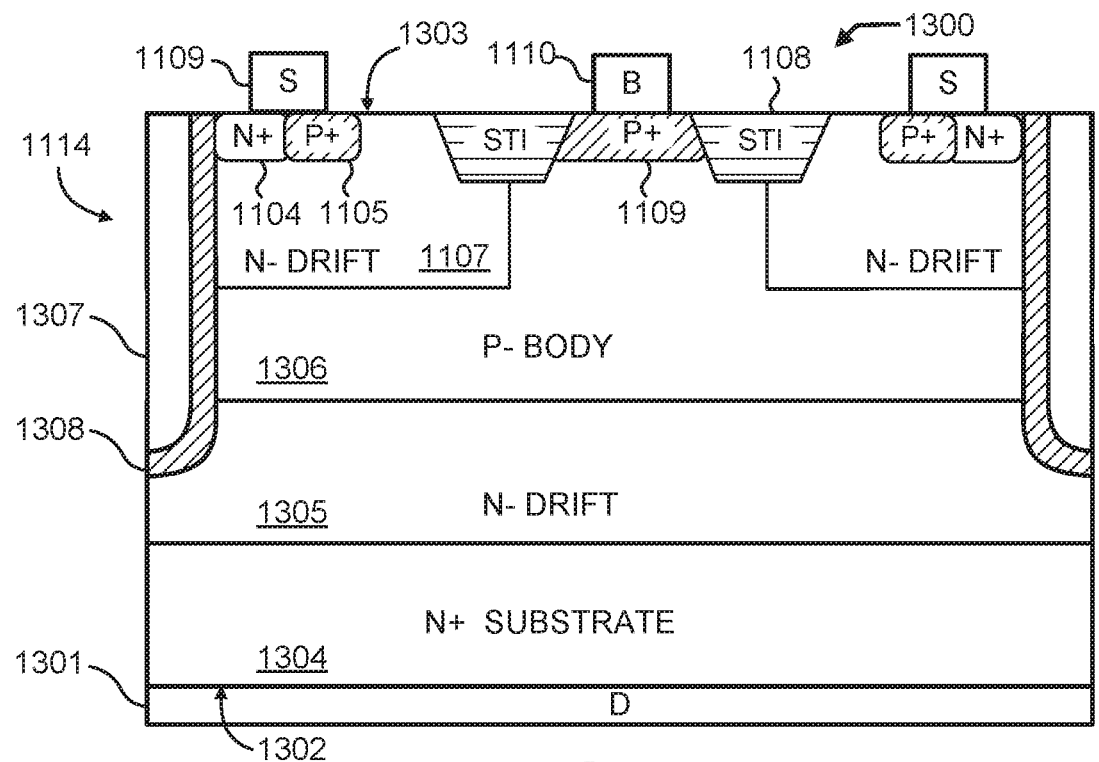
FIGS. 13 and 14 are diagrams illustrating cross-sectional views of the portion of the semiconductor layout illustrated in FIG. 12 in accordance with some embodiments.

FIG. 13 illustrates a cross-sectional view of the unit 1112 first illustrated in FIG. 11 and illustrates portions of the device 1100 at the cross-section along line 4-4' shown in FIG. 12. In FIG. 13, the device 1300 includes a drain contract 1301 at a first surface 1302 along the bottom of the semiconductor substrate. The device 1300 also includes a layer of N-type material such as a N+ substrate 1304, an adjacent first N− drift region 1305, a P− type material such as the P− body region 1306, and a second N− drift region 1107. The N-drift region is first shown in FIG. 11.

The device 1300 further includes the source-located P+ material 1105 and the source-located N+ material 1104. The N+ material 1104 isolates the source-located P+ material 1105 from the gate 1114. The gate 1114 includes a gate material 1307 which is isolated by insulation material 1308 from the first N− drift material, the P− body region 1306, the second N− drift material 1107, and the N+ material 1104. The top surface 1303 of the device 1300 is visible in FIGS. 11 and 12. An insulating layer, such as a deposited oxide layer, may be placed adjacent to the top surface 1303.

A source contact 1106 is coupled to the device 1300 at an intersection of the source-located P+ material 1105 and the source-located N+ material 1104. While the source contact 1106 overlays only a portion of the source-located P+ material 1105 and the source-located N+ material 1104, in other embodiments, the source contact 1106 may completely cover the source-located P+ material 1105, the source-located N+ material 1104, or both the source-located P+ material 1105 and the source-located N+ material 1104. As previously explained, according to another embodiment, locations of the source-located P+ material 1105 and the source-located N+ material 1104 may be reversed as compared to the embodiment illustrated in FIG. 11. STI material 1108 is positioned between the second N− drift material 1107 and the P+ material 1105. A body contact 1110 is positioned adjacent to the P+ material 1105.

Figure 14:
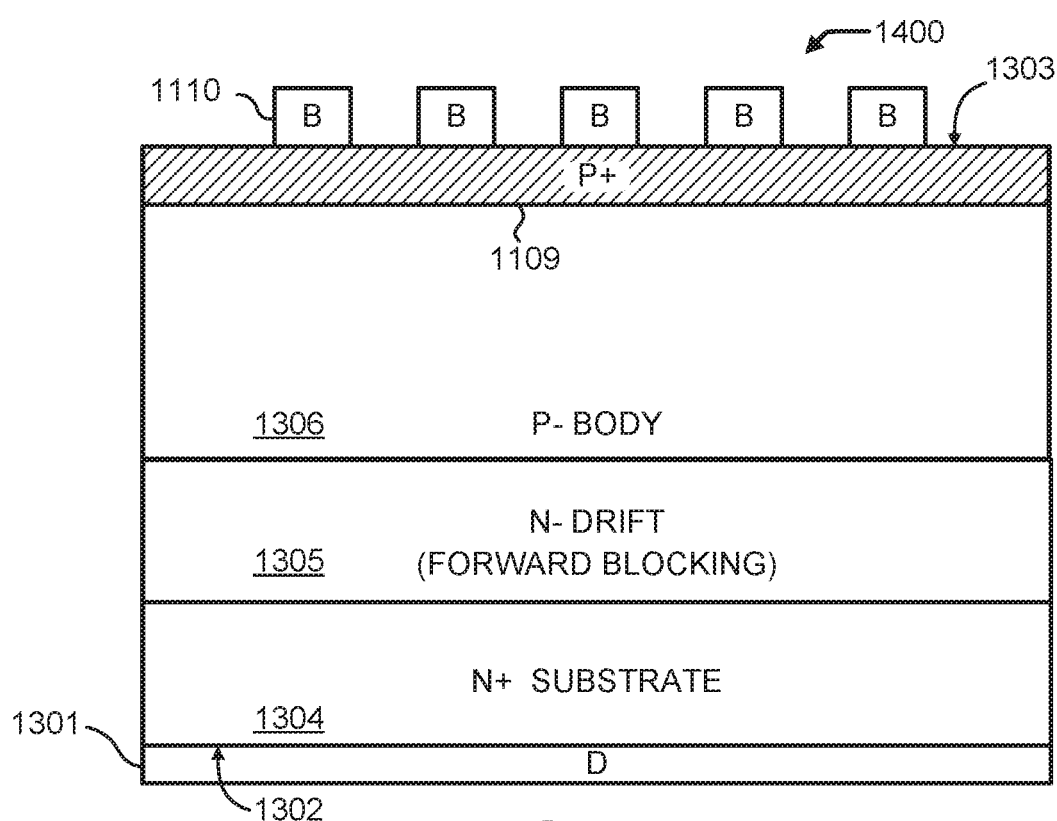

FIG. 14 is a diagram illustrating a cross-sectional view of the unit 1112 first illustrated in FIG. 11 and illustrates portions of the device 1100 at the cross-section along line 5-5' shown in FIG. 12. In FIG. 14, the device 1400 includes the drain contract 1301 at the first surface 1302 along the bottom of the semiconductor substrate. The device 1400 also includes a layer of N-type material such as a N+ substrate 1304, an adjacent first N− drift region 1305, a P-type material such as the P− body region 1306, and a P+ material 1109 along the top of the device 1400. The P+ material 1109 forms the top surface 1303 and is used to make the contacts to the P− body. The column of P+ material 1109 is first shown in FIG. 11. Five body contacts 1110 are positioned adjacent to the body P+ material 1109.

Figure 15:
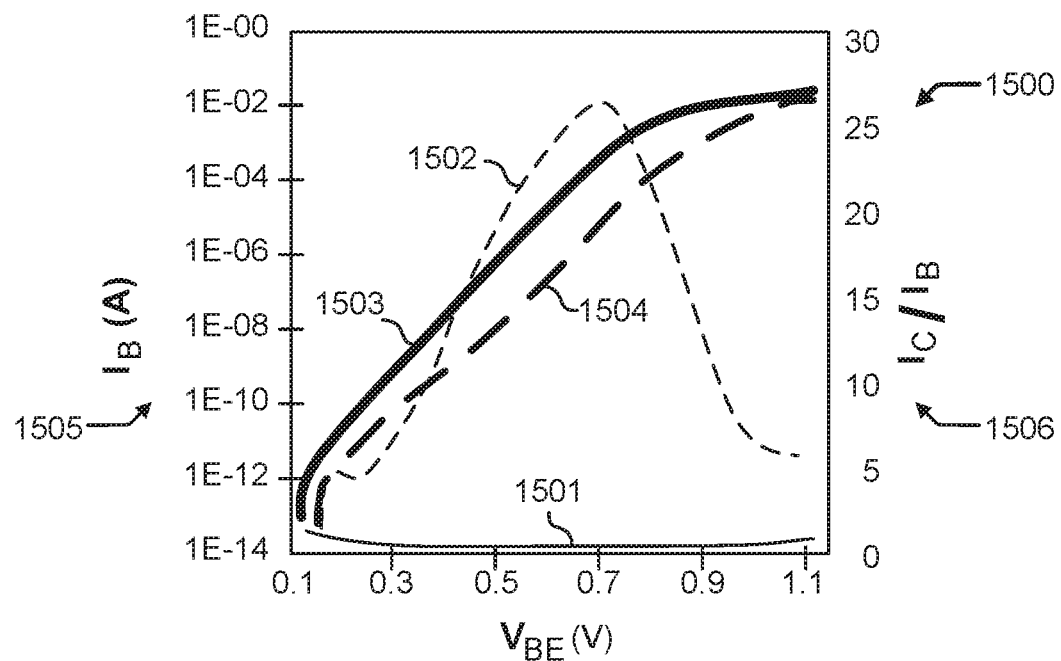
FIG. 15 is a graph illustrating two plots related to parasitic bipolar characteristics for field effect devices in accordance with some embodiments.

FIG. 15 is a graph 1500 that illustrates two plots related to parasitic bipolar characteristics for field effect devices as described herein in accordance with some embodiments. The first plot, as indicated along a first vertical axis 1505, illustrates the body (or base) current $I_B$ versus body-source (base-emitter) voltage $V_{BE}$ applied to two MOSFET devices: line 1501 for a device with a cathode short P+ region proximate a source and line 1502 for a device without such a region. In both cases, the gate is electrically connected to the source and the drain (collector) and is at 5V. In the first plot of FIG. 15, as voltage $V_{BE}$ is increased, current $I_B$ is generally higher for the cathode short device thereby indicating a benefit through an increased contribution of hole current to the base current.

The second plot of FIG. 15, as indicated along a second vertical axis 1506, illustrates the bipolar gain, i.e., the ratio of drain (collector) current $I_C$ to current $I_B$ versus voltage $V_{BE}$ applied to two MOSFET devices: line 1501 for a device with a cathode short P+ region proximate a source and line 1502 for a device without such a region. As the voltage $V_{BE}$ is increased, the ratio $I_C/I_B$ is lower for the cathode short device thereby indicating another benefit through reduction in parasitic bipolar gain. Thus, a field effect device with a cathode short as described herein provides improved performance over other types of structures.

Figure 16:
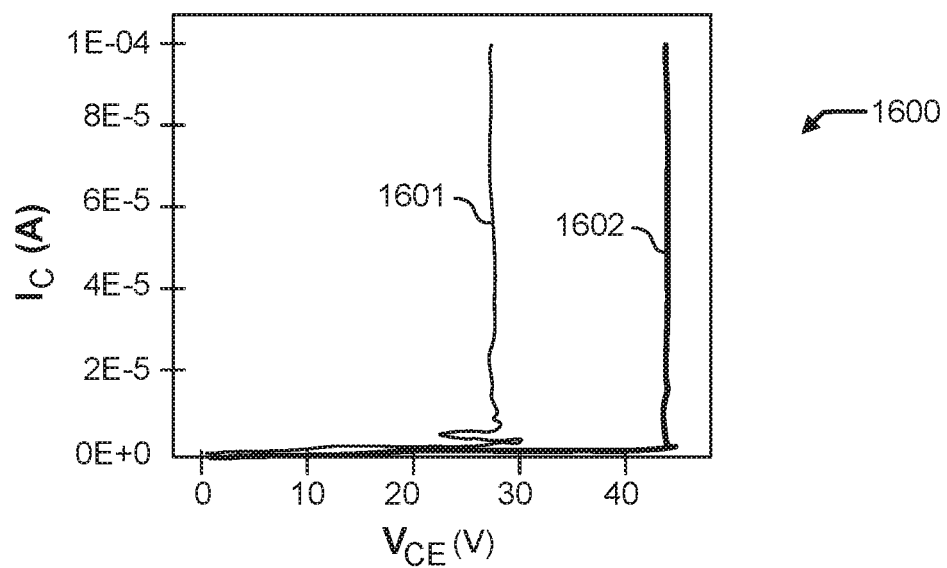
FIG. 16 is a graph that illustrates latch up voltage of a field effect device in accordance with some embodiments.

FIG. 16 is a graph that illustrates latch up voltage of a field effect device in accordance with some embodiments. In FIG. 16, the plot 1600 illustrates current $I_C$ plotted against voltage $V_{CE}$ (drain-source voltage) applied to two MOSFET devices under open body (open base) conditions. In FIG. 16, as voltage $V_{CE}$ is increased, current $I_C$ effectively begins to flow at two different values of latch up voltage $V_{CE}$. The first latch up voltage $V_{CE}$ 1601 is for a MOSFET device without a P+ region in a second N− drift region. The second latch up voltage $V_{CE}$ 1602 is for a MOSFET device with a P+ region in the second N− drift region and adjacent to an N+ region, the P+ region shorted by way of a conducting contact to the N+ region. In FIG. 16, the second voltage $V_{CE}$ 1602 is substantively higher than the first voltage $V_{CE}$ 1601 and thus a field effect device with a cathode short as described herein provides improved parasitic bipolar performance over other types of structures.

Figure 17:
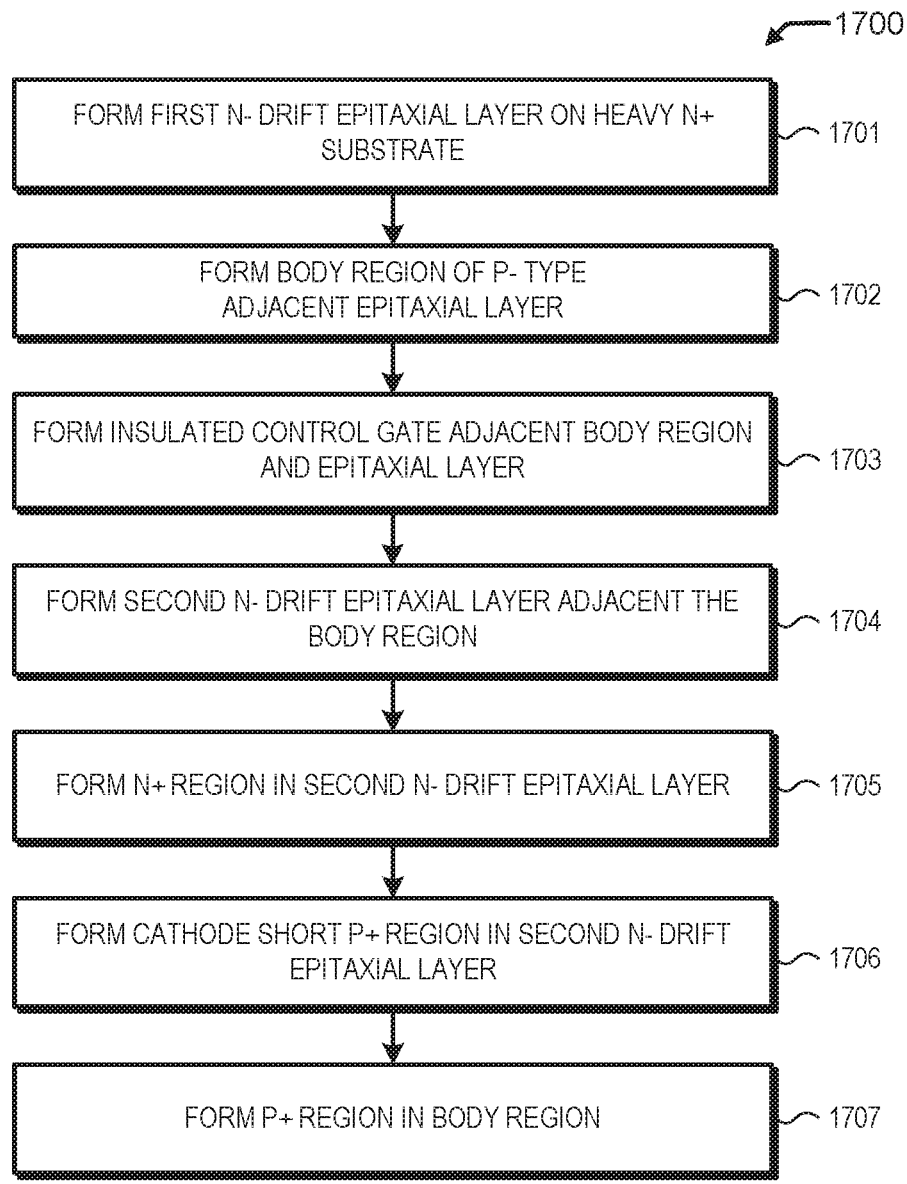
FIG. 17 illustrates a method for fabricating a vertical bidirectional power MOSFET device with a cathode short region according to some embodiments.

FIG. 17 illustrates a method 1700 for forming a vertical bidirectional power MOSFET device with a cathode short region according to some embodiments. The method 1700 includes, at block 1701, forming or growing a first N− drift epitaxial layer on top of a N-type substrate. For example, a first forward blocking N− drift epitaxial layer is grown on a heavy N+ substrate. A second N− epitaxial layer may be grown if desired for a layer of a different doping concentration to create a reverse blocking drift region.

At block 1702, a body region of a P− type is formed as an epitaxial layer adjacent to the first N− drift epitaxial layer. For example, a deep P type buried layer may be implanted to create a body region and a channel. Alternatively, a P type buried layer also could be epitaxially grown after the growth of the first forward N− drift epitaxial layer. A chain P implant may be used for extending the body region all the way to a surface where a body contact may be placed, grown or applied.

At block 1703, an insulated control gate is formed adjacent to the body region and first epitaxial layer. By way of example, this block 1703 may include creation of a trench gate by etching trenches and growing a gate oxide or filling with a gate polysilicon pattern or CMP polysilicon. The polysilicon may be slightly recessed to relieve electric field crowding in a gate dielectric during reverse blocking.

At block 1704, a second N− drift epitaxial layer is formed adjacent to the body region. Body and source contact regions may be isolated at the N-P body junction such as through an STI technique by application of an appropriate material.

At block 1705, an N+ region is formed in the second N− drift epitaxial layer. At block 1706, a P+ region is formed in the second N− drift epitaxial layer. At this block 1706, the P+ region may be shorted such as by contacting the P+ region and the N+ region of block 1705 with a same metal lead, metal contact, or other element. At block 1707, a P+ region is formed in the body region. The formation of P+ regions at blocks 1706 and 1707 could be combined together to be in the same step using appropriate mask layers and processes.

Contacts for the MOSFET device may be created through a plug process or other metallization technique such that body and source are routed out separately, which may be required for reverse blocking. A drain contact may be formed by a backside metallization technique. Implants and contact masks may be designed such that the P+ region of block 1706 is partially or completely overlapped by a source contact and the N+ region of block 1705 is partially or completely overlapped by the source contact.

There are many applications of the techniques and structures described herein. For example, a bi-directional device, which normally has poor SOA may be commercially viable with use of a cathode short. An improved bidirectional device may be used as: a power switch to control all types of loads including resistive, inductive and capacitive; as a device in an H-bridge configuration for DC and pulse width modulation (PWM) motor control; an LED; a light bulb driver including PWM dimming; and a stop start control unit (CRC mode).

Conclusion. MOSFET devices come in a wide variety of forms and employ other materials besides simple metals and oxides. The use of "metal" in MOSFET as used herein can refer to any form of an electrically conductive material (e.g., simple metals, polysilicon, metal alloys, semi-metals, mixtures, semiconductors, conductive organics, conductive silicides, and conductive nitrides). A wide variety of semiconductors may be used for forming MOSFET devices (e.g., types IV, III-V and II-VI semiconductors, organic semiconductors, layered structures, etc.) such as, for example, semiconductor-on-insulator (SOI) structures. Accordingly, "semiconductor" as used herein is intended to include these and other materials, and arrangements suitable for forming field controlled devices. The word "oxide" in the label MOSFET stands for any of a large number of insulating dielectrics, and is not limited merely to oxides. Accordingly, the terms metal, oxide, semiconductor, and MOSFET are intended to include these and other variations.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:
1. A field effect device comprising:
a semiconductor body (101) having a surface (103);
a source (105) coupled to the semiconductor body proximate the surface;
a drain (104) coupled to the semiconductor body and separated from the source;
an insulated control gate (117) located over the semiconductor body between the source and drain and configured to control a conductive channel extending between the source and drain;

a first doped region (116) of a same conductivity type as the semiconductor body adjacent to the source;

a second doped region (114) of a different conductivity type as the semiconductor body, the second doped region adjacent to the first doped region and adjacent to the source; and one or more electrical connections (104, 105) coupling the source and the drain to the semiconductor body.

2. The field effect device of claim 1, further comprising: a source contact (105) covering a surface of the first doped region adjacent to the source.

3. The field effect device of claim 1, further comprising: a fourth doped region (115) of a same conductivity type as the semiconductor body adjacent to a body contact.

4. The field effect device of claim 1, further comprising: a third doped region (110) of a different conductivity type as the semiconductor body adjacent to the drain.

5. The field effect device of claim 4, wherein the semiconductor body includes a first drift region (111) of a different conductivity type as the semiconductor body which forms a N-P junction within the semiconductor body, the first drift region having a doping concentration below that of the third doped region.

6. The field effect device of claim 5, wherein the semiconductor body includes a second drift region (113) of a different conductivity type as the semiconductor body, the second drift region isolating the first doped region and the second doped region from a remainder of the semiconductor body.

7. A method of making a semiconductor device comprising:

on a semiconductor substrate (101) having first and second opposing surfaces (102, 103):

forming a first region (118) in the semiconductor substrate adjacent to the first surface (102), the first surface adjacent to a drain contact (104);

forming a second region (113) in the semiconductor substrate adjacent to the second surface (103), the second surface adjacent to a source contact (105), the second region including a source-located cathode short region (116) the source-located cathode short region (116) being isolated from an insulated gate (117), the source-located cathode short region being of a same conductivity type as the semiconductor substrate;

forming a doped region (114) of a different conductivity type as the semiconductor substrate:

forming a third region (112) in the semiconductor substrate between the first region and the second region, the third region adjacent to a body contact (107); and forming an insulated gate (117) adjacent to at least the first region and the third region.

8. The method of claim 7, wherein the source-located cathode short region is covered by the source contact.

9. The method of claim 7, further comprising: forming a first highly-doped region (110) in the first region adjacent to the drain contact.

10. The method of claim 7, further comprising: forming a highly-doped region (115) adjacent to the body contact.

11. The method of claim 7, wherein the first region includes a first drift region (111) that forms a N-P junction, the first drift region having a doping concentration below that of a remainder of the first region.

12. The method of claim 7, further comprising: forming a second highly-doped region (114) in the second region adjacent to the source contact.

13. The method of claim 12, wherein the second region is positioned to isolate the second highly-doped region and the source-located cathode short region from the insulated gate and the body contact.

14. The method of claim 12, wherein the second region includes a second drift region, and wherein the source-located cathode short region is surrounded by the second drift region.

15. A method of making a semiconductor device comprising:

on a semiconductor body (101) having first and second opposing surfaces (102, 103):

forming a source (105) coupled to the semiconductor body proximate the second surface;

forming a drain (104) coupled to the semiconductor body proximate the first surface and separated from the source;

forming an insulated control gate (117) located over the semiconductor body between the source and drain and configured to control a conductive channel extending between the source and drain;

forming a first doped region (116) of a same conductivity type as the semiconductor body adjacent to the source, the first doped region being isolated from the insulated control gate;

forming a second doped region (114) of a different conductivity type as the semiconductor body, the second doped region adjacent to the first doped region and adjacent to the source; and forming one or more electrical connections (104, 105) coupling the source and the drain to the semiconductor body.

16. The method of claim 15, further comprising: a source contact (105) covering a surface of the first doped region adjacent to the source.

17. The method of claim 15, further comprising: a fourth doped region (115) of a same conductivity type as the semiconductor body adjacent to a body contact.

18. The method of claim 15, further comprising: a third doped region (110) of a different conductivity type as the semiconductor body adjacent to the drain.

19. The method of claim 18, wherein the semiconductor body includes a first drift region (111) of a different conductivity type as the semiconductor body which forms a N-P junction within the semiconductor body, the first drift region having a doping concentration below that of the third doped region.

20. The method of claim 19, wherein the semiconductor body includes a second drift region (113) of a different conductivity type as the semiconductor body, the second drift region isolating the first doped region and the second doped region from a remainder of the semiconductor body.

* * * * *